(12) United States Patent
Low et al.

(10) Patent No.: US 6,425,179 B1
(45) Date of Patent: Jul. 30, 2002

(54) METHOD FOR ASSEMBLING TAPE BALL GRID ARRAYS

(75) Inventors: Qwai H. Low; Chok J. Chia, both of Cupertino; Ramaswamy Ranganathan, Saratoga, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/417,255

(22) Filed: Oct. 12, 1999

(51) Int. Cl.[7] .............................................. M05K 3/34
(52) U.S. Cl. ...................... 29/840; 361/704; 174/16.3; 174/52.4; 29/841; 29/842; 29/846
(58) Field of Search ........................ 29/830, 831, 832, 29/840, 704, 841, 842, 845, 855; 361/749, 813, 789, 707, 774, 767; 174/268, 254, 138

(56) References Cited

U.S. PATENT DOCUMENTS

| | | | | |
|---|---|---|---|---|
| 4,649,415 A | * | 3/1987 | Herbert | 357/74 |
| 5,330,919 A | * | 7/1994 | Westbrook | 437/8 |
| 5,386,342 A | * | 1/1995 | Rostoker | 361/749 |
| 5,506,756 A | * | 4/1996 | Haley | 361/789 |
| 5,838,546 A | * | 11/1998 | Miyoshi | 361/749 |
| 5,844,168 A | * | 12/1998 | Schueller | 174/52.4 |
| 5,888,849 A | * | 3/1999 | Johnson | 361/704 |
| 5,901,041 A | * | 5/1999 | Davies | 361/704 |
| 6,011,694 A | * | 1/2000 | Hirakawa | 361/774 |

* cited by examiner

Primary Examiner—Carl J. Arbes
Assistant Examiner—Sean Smith
(74) Attorney, Agent, or Firm—Luedeka, Neely & Graham

(57) ABSTRACT

According to the present invention, a method for creating a package for a semiconductor die, the package comprising a flexible tape, comprises the following steps. A support with an opening has a plurality of arms extending through at a portion of the opening. For example, for a square opening, there may be eight arms, two extending from each side of the opening. The arms preferably form a "z" shape or some other shape with a transverse component. The flexible tape is then attached to the ends of the arms within the opening such that the flexible tape is supported by the arms. A die is attached to the flexible tape, the die is preferably covered with a molding compound, and the die/flexible tape assembly is scribed from the support, thereby creating an individual package.

14 Claims, 4 Drawing Sheets

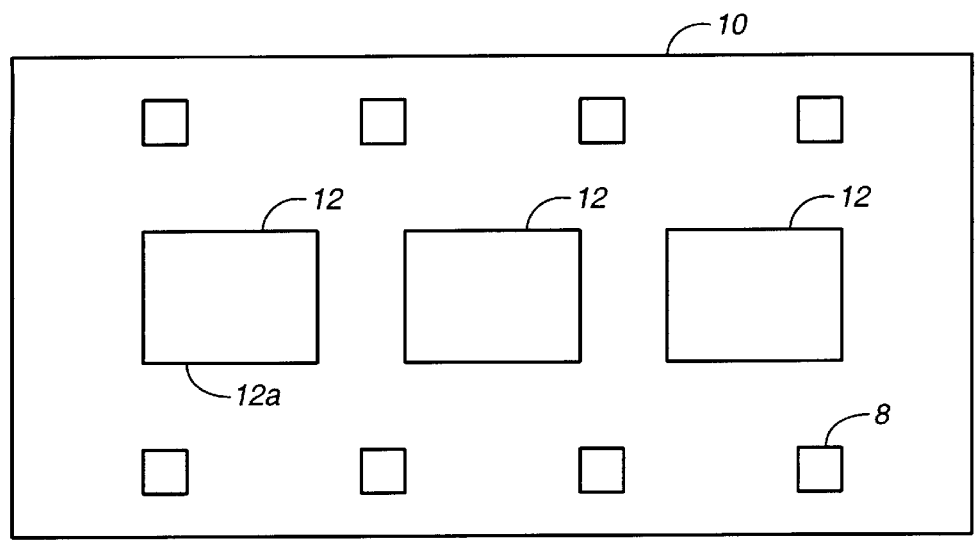
FIG._1a
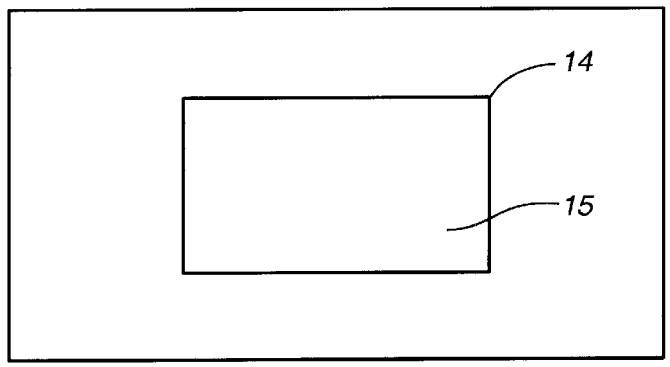
FIG._1b
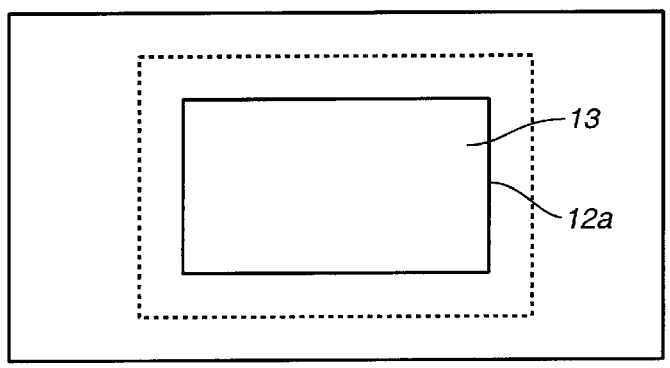
FIG._1c

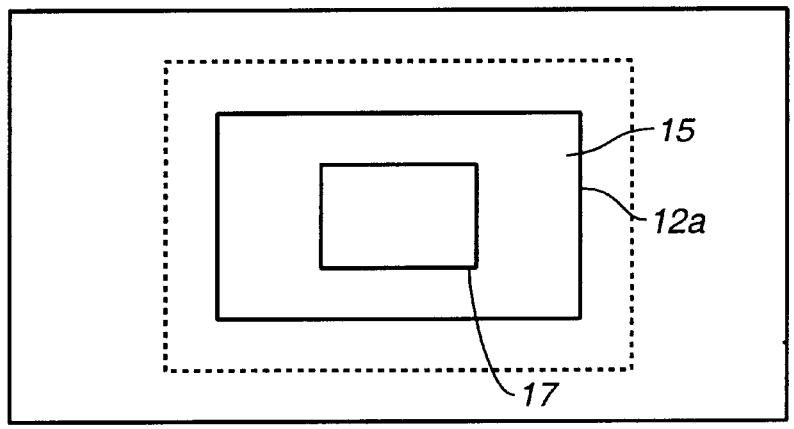
FIG._1d
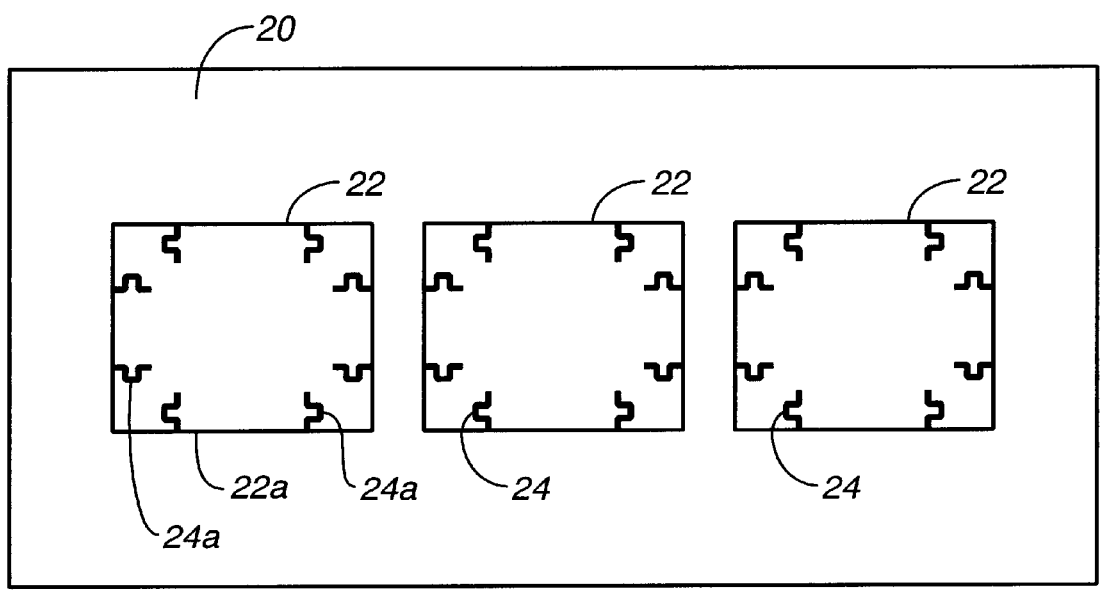
FIG._2

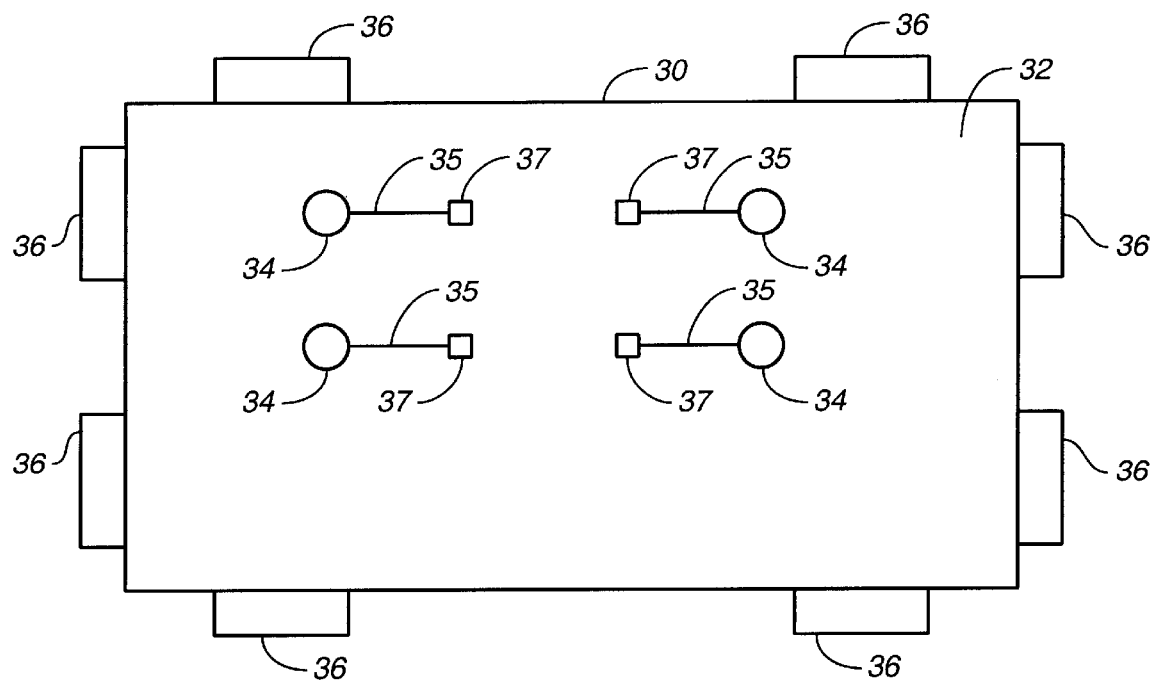
FIG._3a
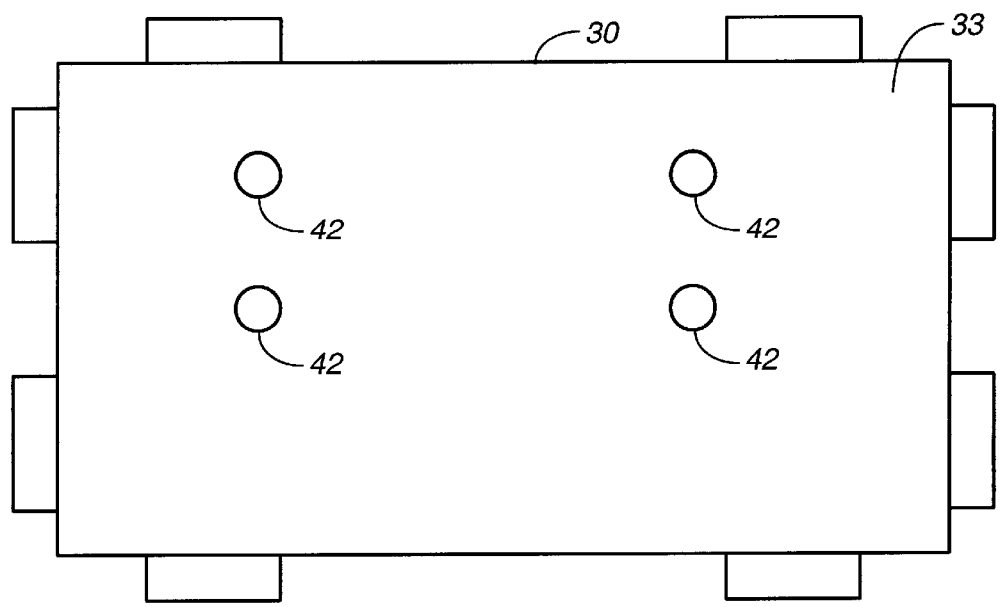
FIG._3b

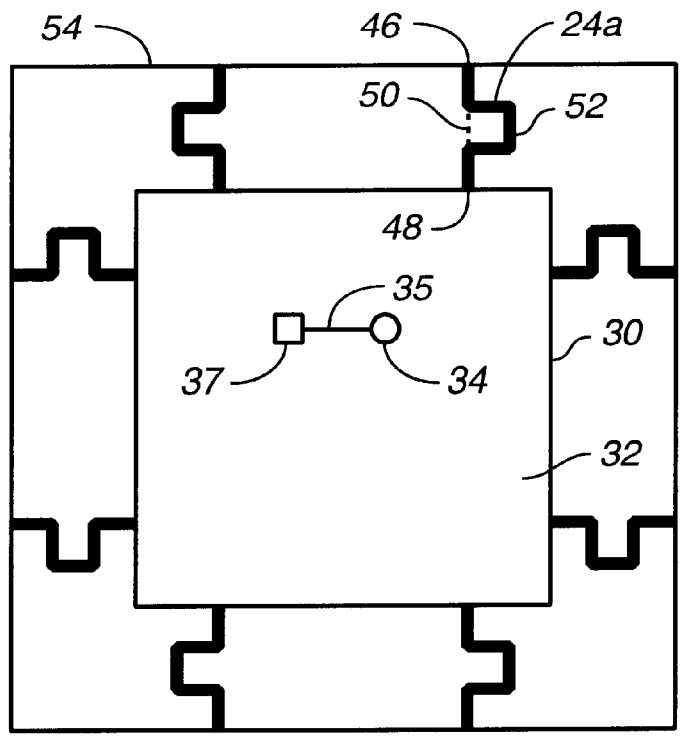
FIG._4
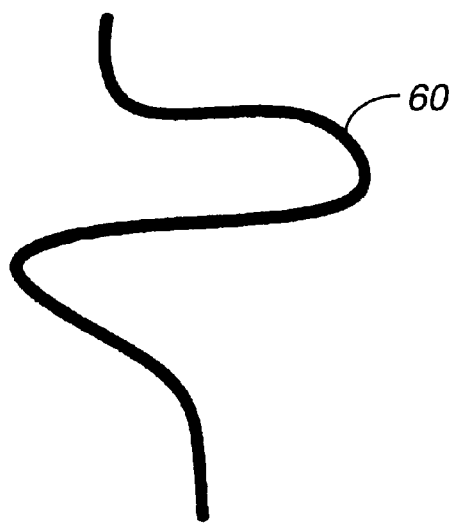
FIG._5

METHOD FOR ASSEMBLING TAPE BALL GRID ARRAYS

BACKGROUND OF THE INVENTION

1. Field of the Invention

This invention relates generally to semiconductor integrated circuit packages, and more particularly to methods and apparatus pertaining to the manufacture of flex tape ball grid array packages.

2. Description of the Related Art

Tape ball grid array packages (TBGA's) are an increasingly common form of packaging for integrated circuits. TBGA's comprise a flexible plastic tape comprising a dielectric material, such as Kapton, and a metal pattern (traces) formed on the dielectric material. The metal pattern is connected to bond pads on an integrated circuit. Each of the traces is connected to a solder ball, which serves as the electrical interface between the package and a printed circuit board. In this manner, integrated circuit bond pads in TBGA's are electrically coupled to an appropriate solder ball.

The flexible tape material is relatively thin and therefore allows the entire package to be correspondingly thin and lightweight. These characteristics are beneficial for systems that are portable, such as cellular phones and other handheld electronic devices.

During the assembly of TBG's, due to the thin nature of the flexible tape, the tape must be supported while a die is attached to it. One conventional support structure for a flexable tape comprises, as shown in FIG. 1a, a metal sheet 10 with openings 12 therein, including opening 12a. The metal sheet 10 has sprocket holes such as hole 8 that allow it to moved along during the assembly process. For ease of description, the packaging of die will be described will be appreciated that the same process is applied to assembly a plurality of packages, one for each of the openings 12.

As shown in FIG. 1b, a flexible tape substrate 14 with a top side 13 (see FIG. 1c), to which a die will be attached, and a bottom side 15, to which solder balls will be attached, is attached to the metal sheet 10. Specifically, an adhesive is applied to the metal around the periphery of the opening 12a and the periphery of the top side 13 is attached to the adhesive. The flexible tape substrate 14 is larger than the opening 12a such that, as shown by dotted line in FIG. 1c, the periphery of the top side 13 is covered by the metal sheet 10 when viewed from the top side 13.

As shown in FIG. 1d, a die 17 is attached to the top side 13 and wire bonds connect bond pads on the die 17 to traces on the top side 13. After connecting the die to the top side 13 of the tape, and the flexible tape substrate 14. Solder balls are then attached to the bottom side 15, of the flexible tape, which also involves heating the metal sheet 10 and the flexible tape substrate 14. Finally, the flexible tape substrate 14 is removed from the support by scribing around the molding to create an individual package.

The metal sheet 10 has different thermal expansion characteristics in comparison with the flexible tape substrate 14. This mismatch causes the flexible tape substrate 14 to warp or stretch when the flexible tape substrate 14 and metal sheet 10 are heated together, which occurs during molding and solder ball attach, as described above. Warping and/or stretching of the flexible tape substrate 14 can damage the fine metal traces on the flexible tape substrate 14 and can cause the resulting package to be warped.

It would be desirable to decrease the warping or stretching of a flexible tape substrate.

SUMMARY OF THE INVENTION

The present invention decreases the warping or stretching of a flexible tape substrate. According to the present invention, a method for creating a package for a semiconductor die, the package comprising a flexible tape, comprises the following steps. A support with an opening has a plurality of arms extending through at a portion of the opening. For example, for a square opening, there may be eight arms, two extending from each side of the opening. The arms preferably form a "z" shape or some other shape with a transverse component.

The flexible tape is then attached to the ends of the arms within the opening such that the flexible tape is supported by the arms. A die is attached to the flexible tape, the die is preferably covered with a molding compound, and the die/flexible tape assembly is scribed from the support, thereby creating an individual package.

BRIEF DESCRIPTION OF THE DRAWINGS

Other objects and advantages of the invention will become apparent upon reading the following detailed description and upon reference to the accompanying drawings in which:

FIGS. 1a through 1d show a conventional method for assembling a tape ball grid array package.

FIG. 2 shows an embodiment of a flexible tape substrate support according to the present invention.

FIGS. 3a and 3b show a top side and a bottom side, respectively, of a flexible tape substrate with tabs according to the present invention.

FIG. 4 shows the flexible tape substrate shown in FIG. 3 attached to the support shown in FIG. 2.

FIG. 5 shows an alternate embodiment of a flexible tape substrate support according to the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 2 shows a first embodiment of a flexible tape substrate support according to the present invention. As shown, a support 20 which is preferably a metal such as copper, has a plurality of openings 22. Each of the openings 22, such as opening 22a which preferably comprises a rectangular opening has a plurality of arms 24 extending therefrom, the openings 22 and arms 24 are preferably created by stamping a metal sheet with an appropriate shape. In the embodiment shown in FIG. 2, the plurality of arms 24 comprises 8 arms, with two arms extending from each of the sides of the opening 22a. As shown in FIG. 3a, a flexible tape 30 with a top side 32 and a bottom side 33 (see FIG. 3b) has a plurality of tabs 36 around the periphery of the flexible tape 30. The top side 32 of the tape 30 includes bond pads 37 for coupling to a die and traces 35 that connect to holes 34 for receiving solder balls 42, as is shown in FIG. 3b.

As shown in FIG. 4, the flexible tape 30 is attached with an adhesive to a corresponding one of the arms 24a such that the arms are attached to the top side of the flexible tape 30. (Note that in FIG. 4, the tabs 36 are obscured by the arms 24a). The opening's area is greater than the area of the flexible tape such that the flexible tape 30 is supported solely by the arms 24a. (For purposes of illustration, only one piece of flexible tape is shown; it will be appreciated that a piece of flexible tape is attached to each of the openings 22.)

As shown in FIG. 4, each of the arms 24a preferably extends from an edge 54 of the support 22 defined by opening 22a to a corresponding one of the tabs 36 such that a beginning 46 and end 48 of each of the arms 24a are aligned on a first axis, shown as dotted line 50, that is perpendicular to the edge 54. Preferably, a portion of the arms 24a extends away from the first axis 50 such that portions 52 of the arms 24a are transverse to the first axis 50. In the embodiment shown in FIG. 4, the arms 24a are "n" shaped.

FIG. 5 shows an alternate embodiment of an arm 60 that may be used as one of the plurality of arms 24a support wherein a plurality of arms are "z" shaped.

After the flexible tape has been attached to the support, the die attach step, the solder ball attach step, the molding step and the scribing steps as described with reference to the related art may be performed. Preferably, a molded layer is disposed such that it does not cover the tabs and the scribing step is performed such that the tabs 36 are not present in the resulting package.

Conclusion

Numerous variations and modifications will become apparent to those skilled in the art once the above disclosure is fully appreciated. It is intended that the following claims be interpreted to embrace all such variations and modifications.

What is claimed is:

1. A method for assembling a die to a flexible tape for a semiconductor package while reducing warping and stretching of the flexible tape during heating steps for assembling components of the semiconductor package, the flexible tape having a first surface and a second surface opposite the first surface wherein the first surface contains bond pads for electrically connecting the flexible tape to the die, the method comprising the steps of:

providing a support material having an opening therein and an opening peripheral edge defining the opening, the support material having at least one arm pending from the opening peripheral edge into the opening, attaching the flexible tape to the at least one arm such that the flexible tape is substantially supported by the at least one arm in the opening, electrically connecting the die to the flexible tape, and removing the flexible ape and attached die from the support material, thereby providing an individual semiconductor package comprising the semiconductor die and flexible tape.

2. The method of claim 1 wherein the opening of the support material is greater than a surface area of the flexible tape such that the flexible tape is suspended within the opening only by the at least one arm after the step of attaching the flexible tape.

3. The method of claim 1 wherein the opening comprises a rectangular opening.

4. The method of claim 1 wherein the step of attaching the flexible tape to the at least one arm comprises attaching the first surface of the flexible tape to the at least one arm of the support material.

5. The method of claim 1 wherein the flexible tape includes a tape peripheral edge and at least one tab pending from the tape peripheral edge and the step of attaching the flexible tape to the at least one arm comprises attaching the at least one tab to the at least one arm of the support material.

6. The method of claim 1 wherein at least a first portion of the at least one arm pending from the opening peripheral edge into the opening is disposed substantially along a first axis which is substantially perpendicular to the opening peripheral edge and a peripheral edge of the tape.

7. The method of claim 6 wherein at least a second portion of the at least one arm pending from the opening peripheral edge into the opening is disposed along substantially a second axis which is substantially transverse to the first axis.

8. The method of claim 7 wherein the at least one arm comprises a "z" shaped arm.

9. The method of claim 7 wherein the at least one arm comprises an "n" shaped arm.

10. The method of claim 1 wherein the at least one arm comprises eight arms pending from the opening peripheral edge into the opening.

11. The method of claim 10 wherein the flexible tape further comprises eight tabs, one each of the eight tabs corresponding to one each of the eight arms pending from the opening peripheral edge into the opening of the support material, the eight arms for receiving the eight tabs and supporting the flexible tape by the eight tabs.

12. The method claim 1 wherein the support material comprises a metal.

13. The method of claim 1 wherein the step of attaching the flexible tape to the at least one arm of the support material comprises adhesively attaching the tape to the at least one arm.

14. A semiconductor die package made by the method of claim 1.

* * * * *